(12) United States Patent
Miller et al.

(10) Patent No.: US 7,056,840 B2
(45) Date of Patent: Jun. 6, 2006

(54) DIRECT PHOTO-PATTERNING OF NANOPOROUS ORGANOSILICATES, AND METHOD OF USE

(75) Inventors: Robert Dennis Miller, San Jose, CA (US); Ho-Cheol Kim, San Jose, CA (US); Eric Connor, Los Gatos, CA (US); Victor Yee-Way Lee, San Jose, CA (US); Gregory Michael Wallraff, Morgan Hill, CA (US); Willi Volksen, San Jose, CA (US)

(73) Assignee: International Business Machines Corp., Armonk, NY (US)

( * ) Notice: Subject to any disclaimer, the term of this patent is extended or adjusted under 35 U.S.C. 154(b) by 238 days.

(21) Appl. No.: 10/676,422

(22) Filed: Sep. 30, 2003

(65) Prior Publication Data

US 2005/0070124 A1 Mar. 31, 2005

(51) Int. Cl.
 *H01L 21/31* (2006.01)
 *H01L 21/469* (2006.01)

(52) U.S. Cl. .............. 438/781; 502/150; 502/232
(58) Field of Classification Search ........... 438/781; 502/150, 158, 232
 See application file for complete search history.

(56) References Cited

U.S. PATENT DOCUMENTS

| | | | |
|---|---|---|---|
| 5,895,263 A | 4/1999 | Carter et al. | 438/624 |
| 6,380,270 B1 | 4/2002 | Yates | 521/50.5 |
| 6,391,932 B1 * | 5/2002 | Gore et al. | 521/61 |
| 6,495,479 B1 * | 12/2002 | Wu et al. | 438/781 |
| 6,645,878 B1 * | 11/2003 | Smith et al. | 438/778 |
| 2002/0127498 A1 | 9/2002 | Doshi et al. | 430/322 |
| 2002/0160600 A1 * | 10/2002 | Eckert et al. | 438/623 |
| 2003/0216058 A1 * | 11/2003 | Ko et al. | 438/761 |
| 2004/0213986 A1 * | 10/2004 | Kim et al. | 428/315.7 |

FOREIGN PATENT DOCUMENTS

| | | |
|---|---|---|
| JP | 06-100725 | 4/1994 |
| WO | WO 02/40571 A | 5/2002 |

OTHER PUBLICATIONS

Hiroyuki Hiraoka and Tsuguo Yamaoka, Acid Hardenable, Spin–Coatable Silicon Ladder Polymer Systems As Resis Materials, Microelectronic Engineering, vol. 13, (1991), pp. 61–64.

Sakata et al., "A Novel Electron Beam Resist System–Acid Catalyzed Conversion of Poly(DI–t–Butoxysiloxane) Into Glass", Journal of Photopolymer Science and Technology, vol. 5, No. 1, 1992, pp. 181–190.

* cited by examiner

*Primary Examiner*—George Fourson
*Assistant Examiner*—Fernando L. Toledo
(74) *Attorney, Agent, or Firm*—Richard M. Goldman; Daniel Johnson (57) ABSTRACT

A low dielectric constant, patterned, nanoporous material and a method of forming the material. The material is formed by depositing a layer onto a substrate, said layer comprising a reactive organosilicate material, a porogen, an initiator, and a solvent; exposing portions of the layer to energy (e.g., thermal energy or electromagnetic radiation) to change the solubility of portions of the organosilicate material with respect to the solvent; selectively removing more soluble portions of the layer to generate a relief pattern; and decomposing the porogen to thereby generate a nanoporous organosilicate layer.

26 Claims, 9 Drawing Sheets

DIRECT PHOTO-PATTERNING OF NANOPOROUS ORGANOSILICATES, AND METHOD OF USE

TECHNICAL FIELD

The present invention relates to a method for photo-patterning a nanoporous material having a low dielectric constant, k.

BACKGROUND

With the ever-growing demand for higher performance at lower cost, the feature dimensions of integrated circuits continue to shrink. As a consequence, there is an increase in the interconnect (RC) delay and signal degradation at the back-end-of-line (BEOL) wiring of semiconductor chips. In order to reduce the capacitance, effort has been focused on development of new low dielectric constant insulating materials having a dielectric constant lower than silicon dioxide, which is a current insulating material. Due to the low dielectric constant of air (k~1), thin films containing nanometer-sized pores have been recognized as the only viable approach for meeting the goal of dielectric extendibility (that is, the same material composition, varying only in dielectric constant, k) for advanced semiconductor devices. Ideally the k value of a layer decreases in proportion to the fraction of air introduced in the layer. Much effort has been devoted to the generation and characterization of various porous materials.

Efforts to integrate porous dielectrics into chip structures continue. Current BEOL integration schemes require multiple films for pattern generation and protection of the dielectric materials. Patterning spin-on dielectrics involves patterning photoresists coated on dielectrics and subsequent etching and removal of photo-resists. Generally BEOL processing constitutes about 75% of total wafer process cost. There is a continuing desire to simplify BEOL processing and improve performance. However, designing these materials with a controlled porous structure combined with patterning ability is not trivial. A simple, more effective route to patterned, high areal density arrays (e.g., nanoporous thin films) would be highly desirable. Recently, methods for forming a patterned mesoporous material have been described (U.S. Patent Application Publication, US2002/0127498 A1 to Doshi et al.; Clark, Jr. et al., Chem. Mater. 2000, 12, 3879), but the porous films in these studies are limited to hydrophilic silica and show variable morphologies, since the porous structure was generated from dynamically templated organic/inorganic hybrid films using surfactants.

SUMMARY OF THE INVENTION

Disclosed herein is a method for direct photo-patterning of nanoporous thin films having ultra low dielectric constants. We employ a radiation-sensitive initiator in a mixture of an organosilicate (e.g., poly (methyl silsesquioxane), PMSSQ) and thermally labile organic polymer (e.g., organic polymeric unimolecular amphiphiles for templating or labile miscible materials for nucleation and growth) as porogens. The patterning process described herein can be applied to generate both negative and positive patterns, where direct exposure to energy (such as UV light, x-rays, e-beams, or the like) either crosslinks or degrades the organosilicate through the initiator or by direct absorption of the matrix. In the case of a negative photoresist, the activated initiator causes crosslinking of the organosilicate. Direct exposure with UV light crosslinks the matrix organosilicate via the action of the photoinitiator. In the case of nucleation and growth processes, crosslinking is associated with phase separation between the organic porogen polymer and the crosslinking organosilicate matrix. In the case of templating, the porogens are compatible with the matrix but not miscible in the initial mixtures.

Patternwise exposure through a mask and development (e.g., wet development) generates patterned nanohybrid, composite films where the organic porogen polymers are entrapped into and encapsulated within the thermosetting organosilicate matrix. Subsequently, pores are generated by removing (e.g., decomposing) the entrapped organic porogen phase using thermolysis, ozonolysis, supercritical fluids, or solvent extraction methods. The simplicity of the patterning process for low dielectric constant nanoporous materials is a major advantage of this invention. Furthermore, this strategy can provide patterned nanoporous substrates useful for bio-applications, catalytic and electrochemical applications by manipulating film morphologies and controlling surface energies with simple oxidation methods.

The invention includes a method for forming direct photo-patterned nanoporous materials, typically amorphous, and typically on a substrate. A radiation-sensitive initiator, typically a photoacid generator, in a mixture of an organosilicate and a porogen (for example, a thermal- and/or radiation-labile organic polymer capable of decomposition to small molecules and subsequent volatilization to form a nanopore thereby) in response to irradiation induces changes (such as solubility and/or chemical constitution) of the organosilicate materials in the portions of the thin film exposed to radiation.

In negative pattern generation processes, this change in chemical constitution of the organosilicate is typically a further polymerization or crosslinking, and is evidenced by a decrease in solubility in the solvent. It may also be marked by driving the porogen out of polymer solution or mixture into another dispersed phase when the porogen is initially miscible. Selectively removing unexposed portions of the film generates a relief pattern and removing (e.g., decomposing) the porogen generates a porous, isotropic, disordered material.

Alternatively, the process may be a "positive" pattern generation process in which exposure to light is evidenced by an increase in solubility.

By a "micelle" as used herein we mean an aggregation of the volume of about 50 to 100 porogen polymers, the exact size thereof being a function of the ratio of surface per unit mass of the porogen.

By "templating" as used herein we mean a process in which an immiscible porogen is dispersed in the matrix composition, with the particle-like templating porogens templating the pores within the crosslinking matrix. In templating, below a percolation threshold, one particle-like templating porogen produces one pore with the pore size determined by the porogen size. Above the percolation threshold, networks of interconnecting pores are formed.

BRIEF DESCRIPTION OF THE FIGURES

Various aspects of our invention are illustrated in the Figures appended hereto.

DETAILED DESCRIPTION OF THE INVENTION

Patterned nanoporous films find utility in electronic structures. These structures comprise a substrate having a patterned, nanoporous, low dielectric constant film thereon. In one exemplification the pattern has sub-micron to millimeter feature sizes and nanometer scale pores. More particularly, the electronic device, for example an integrated circuit or an integrated circuit as a packaged module, includes a substrate having a patterned, nanoporous, low dielectric constant poly (silsesquioxane) film. The pattern in the nanoporous film has sub-micron to millimeter feature sizes, with pores from less than about 0.01 to about 0.5 times the minimum feature size to reduce the dielectric constant, k. This results in a dielectric constant, k, of the film of from about 1.3 to about 2.5.

As will be described more fully herein below, the nanoporous film is formed of an organosilicate polymer generally having the formula $(RSiO_{1.5})_n$, where R is independently hydrogen, a methyl, ethyl, higher alkyl, vinyl or phenyl group (including substituted aromatics) and n is greater than 10 and generally from about 10 to about 500 or more, with the degree of polymerization being high enough to maintain the desired nanoporous structure.

In one embodiment, the electronic device is an integrated circuit, and the patterned, nanoporous, low dielectric constant film is interposed between a semiconductor region and circuitization.

Two types of pore generation can be utilized. In the first, the formation of pores by the nucleation and growth process, the porogen is initially, at least, partially miscible in the composition, but becomes immiscible with increasing crosslinking of the matrix defining domains of porogen. In the second type, the formation of pores by the templating process, the porogen is not miscible with the resin prior to curing, but is instead molecularly dispersed in the matrix before crosslinking. The pore morphology is compositionally invariant below the percolation threshold, while above the percolation threshold an interconnected network or multiple networks of pores are formed. Below the percolation threshold, one porogen molecule produces one pore of the porogen size. In the case of templating porogens, the size of the porogen particle can be engineered as a function of porogen molecular weight and synthesis conditions.

In negative tone photolithographic patterning of the type described herein, exposing regions of the major phase (the organosilicate matrix) will become more crosslinked and therefore less soluble, while the unexposed regions of the major phase (organosilicate) will remain less crosslinked and remain more soluble. Upon development, the more soluble regions will be removed. Also, during crosslinking, the porogen phase will either phase separate (nucleation and growth) or remain phase separated (templation) from the crosslinking matrix.

According to a preferred implementation of our invention, the first step in forming the low dielectric constant, nanoporous organosilicate film is forming a composition of the matrix-forming material and the porogen in a suitable solvent (e.g., propylene glycol methyl ether, cyclohexanone, methylisobutyl ketone, or γ-butyrolactone). The porogen is a decomposable polymer, and it is preferably radiation decomposable or thermally decomposable. When the porogen is a radiation decomposable polymer, it decomposes substantially simultaneously with polymerization of the matrix during photolithographic patterning. That is, it decomposes upon exposure to radiation, e.g., ultraviolet light, x-rays, electron beams or the like. When the porogen is a thermally decomposable polymer, the thermally decomposable polymer undergoes thermal decomposition after the formation of the crosslinked matrix and at temperatures at or above the temperatures normally encountered in photolithography. This includes temperatures encountered in development processes, solvent processes, and post-baking processes. However, one wishes to avoid removal of the porogen until there is either some phase separation of the decomposable porogen material from the host matrix for nucleation and growth, and/or the matrix is stiffened sufficiently to support the developing porosity.

After crosslinking and, optionally, exposure to radiation, and either during or after development of the pattern in the host matrix, the dispersed porogen (also referred to as an organic, sacrificial porogen), now dispersed throughout the host matrix as domains, unimolecular particles or micelles, inclusions, templates, and the like, is removed (e.g., decomposed) to create pores, and the decomposition products are expelled from the surrounding host matrix film. This may be through such processes as thermolysis, ozonolysis, UV assisted ozonolysis, oxidizing plasmas, and solvent extraction, including extraction with supercritical fluids.

In nucleation and growth, due to the nature of the phase separation mechanism during polymerization and/or crosslinking of the host matrix with formation of a second phase of porogen domains, or dispersed inclusions representing regions of approximately molecular size, the isotropic porous microstructures that form have a significantly random component. This is because in a nucleation and growth mechanism there is random nucleation of the sacrificial porogen. For the nucleation and growth process, the morphology and dimensions of the pores are determined mainly by the interactions between the porogen (dispersed phase) and the host matrix polymers (matrix), the molecular weight of the porogen, and the composition of the mixtures, that is, of the host matrix precursor, the porogen, the solvent system, and the photoinitiator, as well as surfactants, plasticizers, additives, and the like. In the case of temptation porogens, the pores will mimic the molecular size and shape of the porogen.

Patterned nanoporous films may be formed from a blend of a matrix-forming organosilicate, a sacrificial porogen, an initiator, and a solvent. In the case of pore formation by nucleation and growth, this blend undergoes a phase separation upon polymerization of the matrix-forming organosilicate to form a two phase system of dispersed sacrificial porogen domains in an organosilicate polymer matrix. Generally, the pore size should be on the order of from about one one-hundredth (0.01 times) to about one half (0.50 times) the feature size for on-chip dielectric application. In the nucleation and growth embodiment, pore formation is initiated by a kinetically arrested phase separation where one component, e.g., the major phase or matrix, crosslinks into a network, thereby effectively limiting subsequent domain growth and coarsening of the sacrificial porogen phase.

For organosilicate host matrix materials, the crosslinking reaction of the matrix materials can occur by heating (thermal crosslinking) or irradiation (photochemical crosslinking), as in negative photolithography where the host matrix material becomes less soluble after exposure to the radiation and subsequent development and retains the exposure pattern after development.

Negative photoresist processing of organosilicates usually requires a photosensitive agent which generates acid or base when exposed to light or radiation. Direct absorption of the light or the radiation by the organosilicate can also initiate crosslinking. Since the initiation of photochemical crosslinking is limited only to the exposed areas, this method provides a route to generating patterns.

It is, of course, to be understood that the organosilicate, such as silsesquioxane, can also be processed as a positive photoresist, that is, as a photoresist where exposed regions develop more rapidly than unexposed regions. This can be accomplished in a number of ways. For example, acid labile groups can be incorporated in the silsesquioxane matrix (as described U.S. Patent Application Publication US2002/0090572A1 to Sooriyakumaran et al. titled "Substantially transparent aqueous base soluble polymer system for use in 157 nm resist applications", published Jul. 11, 2002), which undergo acid catalyzed deprotection upon imagewise exposure in the presence of suitable photoacid generators. Alternatively, the porogen itself can be functionalized in a similar fashion so that a solubility change subsequent to exposure results in dissolution of the film in a positive tone fashion. An example of a functionalized nucleation and growth type porogen would be a polyacrylate containing acid labile tert-butyl protecting groups.

Through the introduction of a sacrificial porogen that is compatible with the photolithographic process, the present invention provides a process for direct photo-patterning of nanoporous organosilicate dielectrics. The patterned nanoporous organosilicate dielectrics of the present invention are formed in a process as shown schematically in FIGS. 1, 2, and 3.

Figure 1:
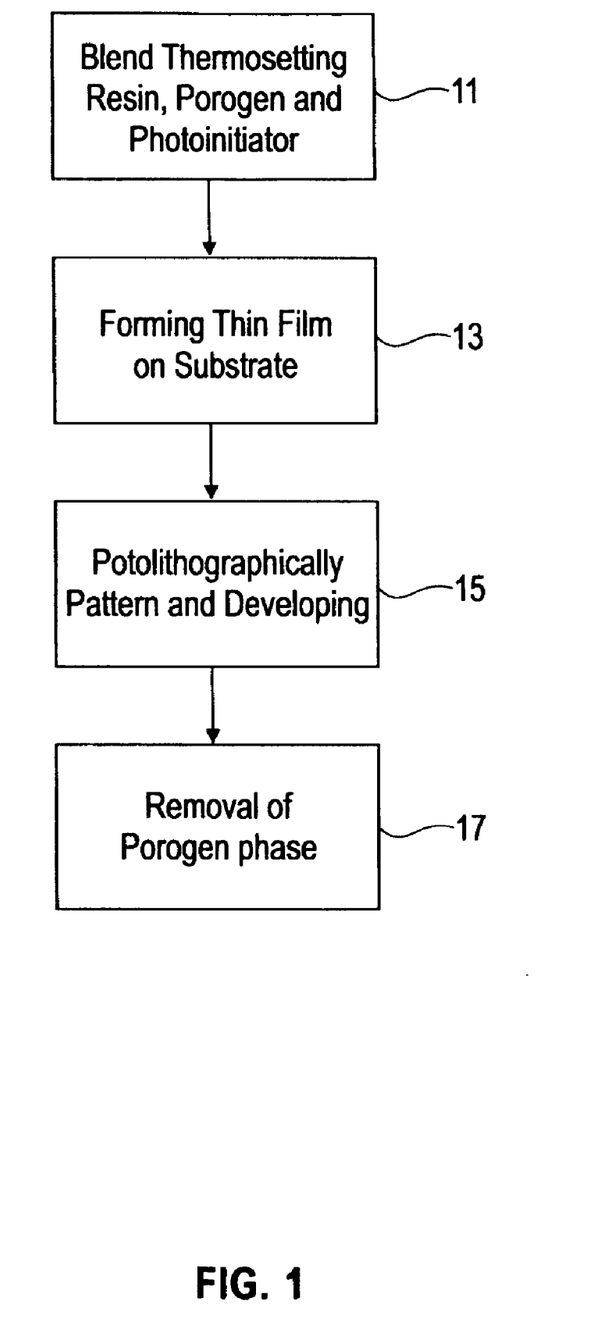
FIG. 1 is a flow chart showing the photopatterning process steps of a preferred implementation of this invention, including: blending the thermosetting resin, porogen, and photoinitiator; spin coating the blend onto the substrate in the form of an inorganic/organic nanohybrid, that is, a hybrid or mixture of organic porogen, photoinitiator, and organosilicate inorganic matrix; and thereafter photolithographically patterning and developing the matrix film, and generating the nanoporosity by removing (e.g., decomposing) the labile porogen.

FIG. 1 is a flow chart showing the process steps of blending the thermosetting resin and porogen, 11, and spin coating the blend onto the substrate, 13. This is followed by photolithographically patterning the film, 15, and generating the nanoporous structure, 17.

Figure 2:
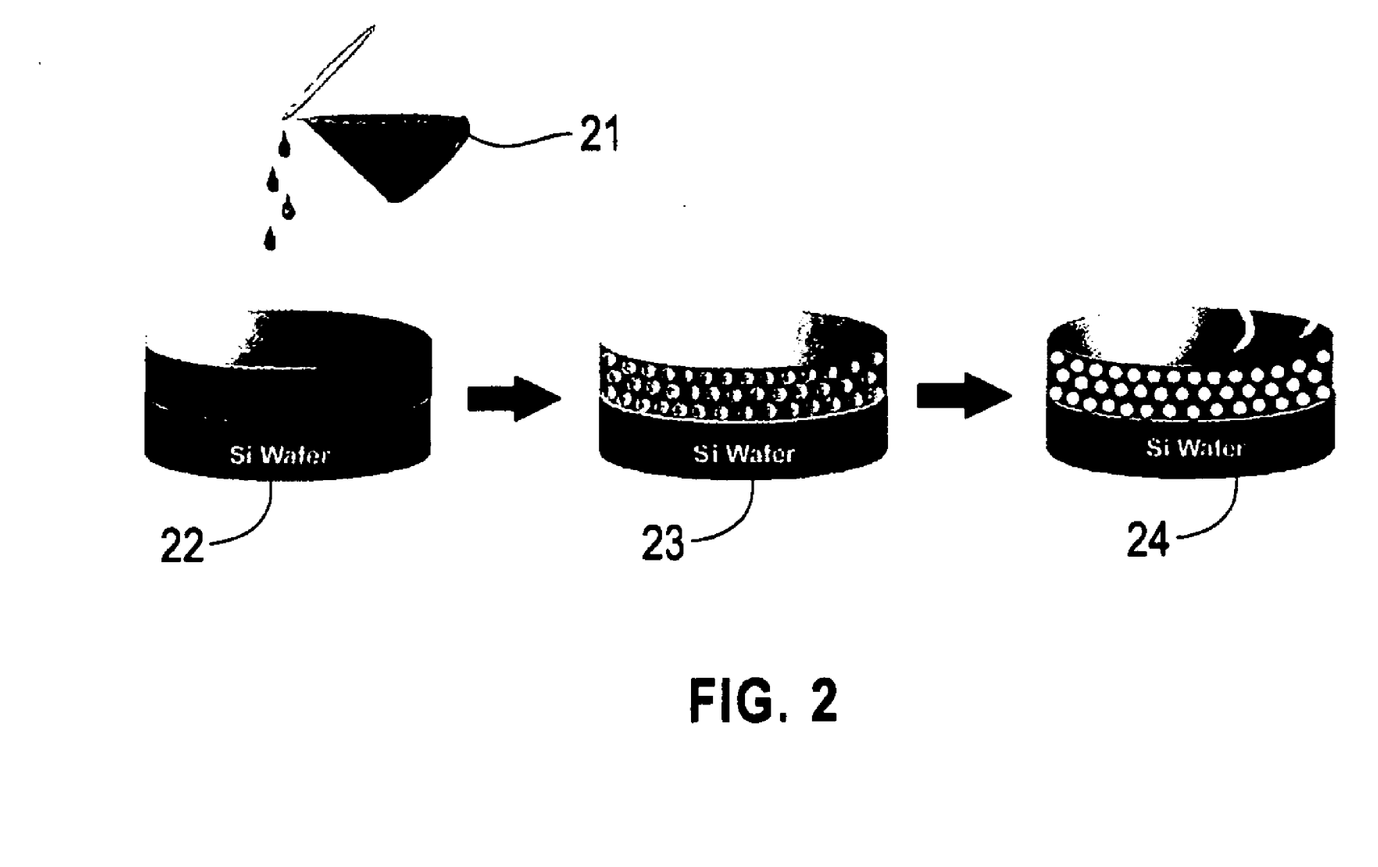
FIG. 2 is a schematic diagram of forming the blend, spin coating the blend onto a substrate (on which is shown the heterogeneous material with matrix and porogen), inducing phase separation, and decomposing the porogen and driving off a product of porogen decomposition.

FIG. 2 is a schematic diagram of forming the blend, 21, spin coating the blend onto a substrate, 22, to form the thin film of the heterogeneous material with matrix and porogen, 23, and decomposing the porogen and driving off a product of porogen decomposition, 24. Decomposing the porogen may be done during or after patterning.

Figure 3:
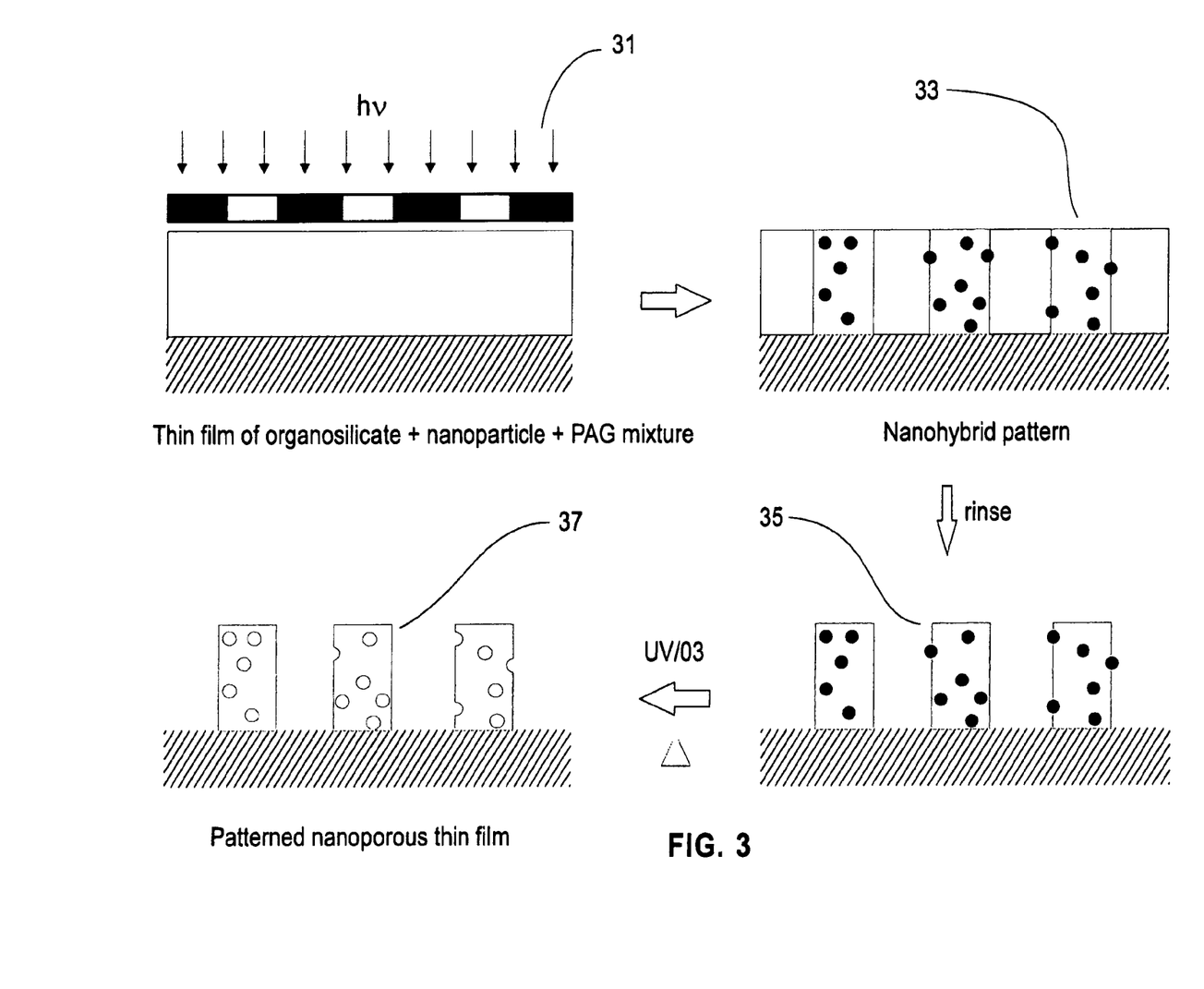
FIG. 3 is a schematic diagram of the patterning process, including forming a thin film of matrix material, porogen, solvent, and photoinitiator, exposing the film to radiation to form the latent image in the matrix by phase separation, developing and rinsing to resolve the pattern, and decomposing the porogen to create the porous nanostructure.

FIG. 3 is a schematic diagram of the patterning process, including forming a thin film of matrix material, porogen, solvent, and photoinitiator (as in FIG. 2), exposing the film to radiation form the latent image in the matrix, 33, developing and rinsing to resolve the pattern, 35, and decomposing the porogen to create the porous nanostructure, 37.

The first step involves dissolving the organosilicates, porogen and radiation-sensitive initiator in a suitable solvent (e.g., 1-methoxy-2-propanol acetate) and applying the solution to the substrate by spraying, spin coating, dip coating or doctor blading, so that the uniform thin films of porogen/organosilicate/initiator mixture, with optional solvents, surfactants, plasticizers, and the like, are formed on the substrate. Suitable substrates include silicon, silicon dioxide, glass, metal, ceramics, high temperature polymers or any other suitable material.

The preferred matrix materials include organosilicates, such as those disclosed in U.S. Pat. No. 5,895,263 issued Apr. 20, 1999 to Carter et al. (incorporated herein by reference), including the family of organosilicates known as silsesquioxanes, $(RSiO_{1.5})_n$. Suitable silsesquioxanes for the present invention include hydrido (R=H), alkyl (R=methyl, ethyl, propyl, and higher alkyl), aryl (R=phenyl) or alkyl/aryl, vinyl, and copolymers thereof, as well as polymethylsilsesquioxane (PMSSQ), which are commercially available from Dow Corning, Techneglas, LG Chemicals, and Shin-Etsu, for example. Most commonly, the silsesquioxane is poly (methyl silsesquioxane), $((CH_3)SiO_{1.5})_n$, and n is 10 to 500 or more (including copolymers). As used herein organosilicates include silsesquioxane thermoset resins generally represented by the formula $(RSiO_{1.5})_n$ as described above, including copolymers of one or more of the monomers $(Si(R)O_{1.5})$, $(SiO_2)$, $(SiR_2O)$, and $(SiR\ SiO_3)$, in which R is defined above.

Figure 4:
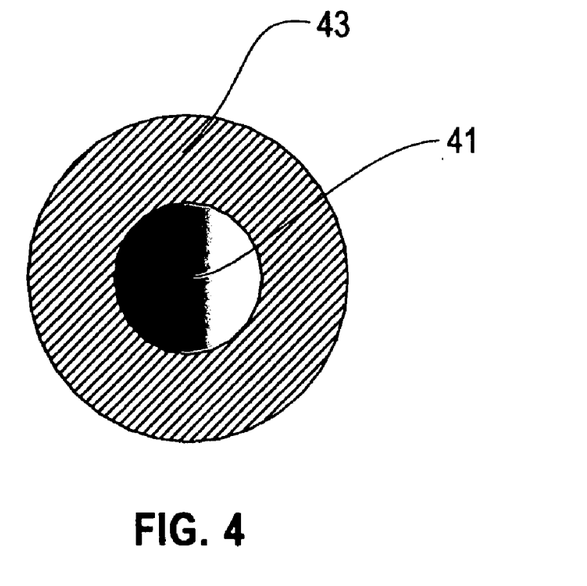
FIG. 4 is a representation of a porogen nanoparticle having a hydrophobic core and a hydrophilic shell for use in templating.

FIG. 4 illustrates amphiphilic core-shell porogens with an immiscible (in the matrix medium) hydrophobic core, 41, and a miscible, hydrophilic shell or corona, 43. (Alternatively, the core, 41, may be hydrophilic and the corona, 43, hydrophobic.) Suitable immiscible, hydrophobic, polymer functionality for the core, 41, of the nanoparticles are nonpolar polymers such as polystyrene, poly α-methyl styrene, polynorbonene, polylactones, polylactides, polybutadiene, polyisoprene, polyolefins, polyisobutylene. Suitable polymers for the miscible, hydrophilic functionality of the shell or corona, 43, of the nanoparticles are polyethyleneglycol, polypropylene glycol, polyhydroxyalkylmethacrylate, polyalkyleneoxide acrylate/methacrylates, sugars, carbohydrates, polyvinyl alcohol, polyethyleneimines, polyoxazolines, polypeptides, polyvinylpyridines, acrylamides, and N,N-dimethylacrylamides. The particles may additionally be crosslinked in the core, in the corona, or both. Alternatively, crosslinked particles may be prepared by microemulsion, dispersion, or suspension polymerization techniques.

It is to be understood that in the templating process the nanoporosity of the dielectric can be engineered and controlled by the particle size distribution of the porogen dispersed in the media, the concentration of the porogen, and the surface tensions of the solvent, the matrix former, and the porogen. In the case of nucleation and growth porogens the nanoporosity of the dielectric can be engineered and controlled by the molecular weight of the porogen, the functionalities of the porogen, resin structure, and the surface tensions of the solvent, the matrix, and the porogen.

Figure 5:
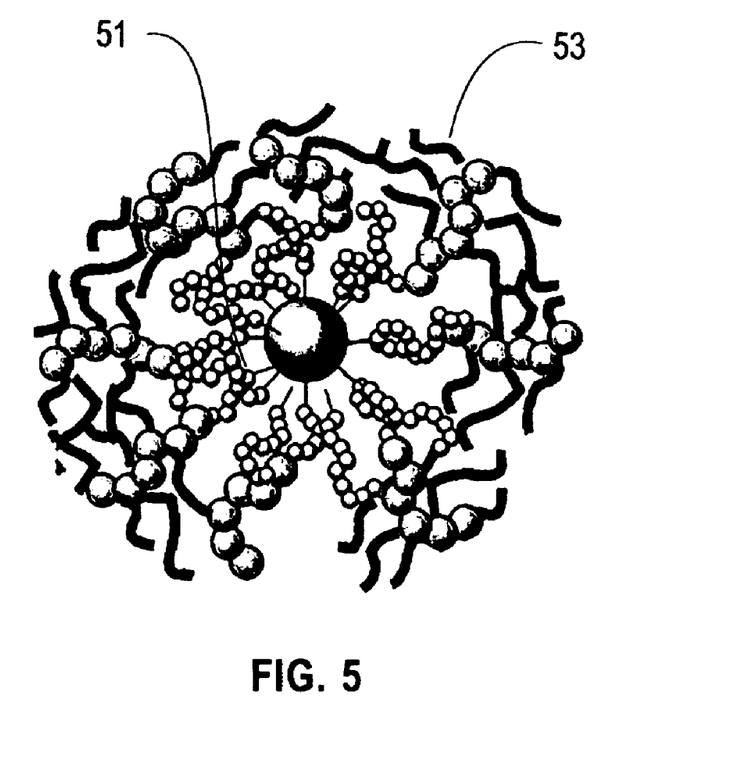
FIG. 5 is a representation of an amphiphilic nanoparticle with a hydrophobic core and a hydrophilic corona.
Figure 6:
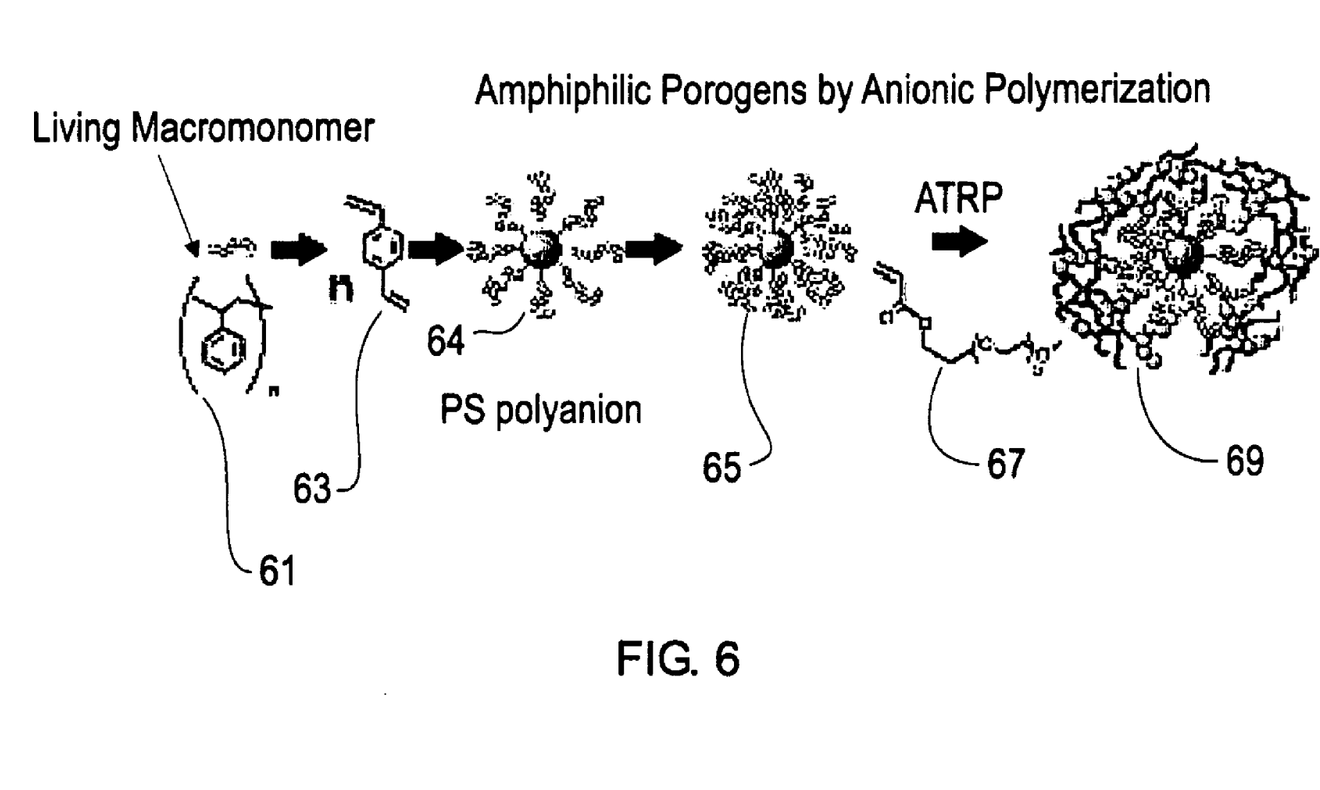
FIG. 6 shows the reaction pathway to form an amphihilic porogen by anionic polymerization, starting from a "living macromonomer" (that is, a macromonomer capable of further polymerization) with unsaturation sites, forming a branched polystyrene (PS) polyanion using a branching agent such as divinylbenzene, reacting the polyanion with functionality capable of serving as an atom transfer polymerization initiator, and subsequently growing a corona by Atom Transfer Radical Polymerization (ATRP) techniques.

FIG. 5 is a representation of an amphiphilic nanoparticle with a hydrophobic core, 51, and a hydrophilic corona, 53. FIG. 6 shows the reaction pathway to form an amphiphilic porogen by anionic polymerization starting from a "living macromonomer" (that is, a macromonomer capable of further polymerization), 61, with unsaturation sites, 63, forming a branched PS polyanion, 64, to form the structure illustrated as element 65. The intermediate is reacted, 67, through Atom Transfer Radical Polymerization ("ATRP") to form the amphiphilic porogen, 69. Such a material is termed a unimolecular, polymeric micelle whose structure is fixed by chemical bonding. Such structures avoid the dynamic assembly process characteristic of small molecule and linear block copolymer amphiphiles. Such materials may be prepared by any established living polymerization technique such as living methathesis polymerization, living free radical polymerization, living anionic polymerization, living cationic polymerization and living ring opening polymerization for example. Crosslinked polymeric nanoparticles and stars having amphiphilic core-shell structures are useful for templating, and are described in E. F. Connor et al., "Self Organized Unimolecular Polymers," Angew. Chem. Int. Ed. 2003 (42), 3785–3788.

Figure 7:
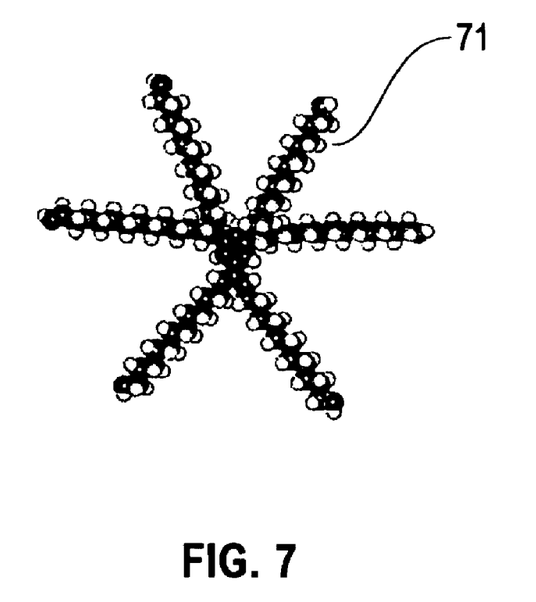
FIG. 7 is a space filling model representing a star polymer for use in nucleation and growth pore formation.
Figure 8:
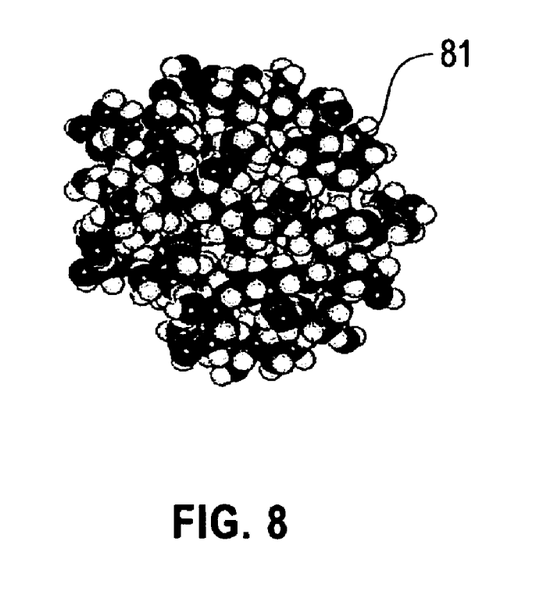
FIG. 8 is a space filling model representing a hyperbranched polymer for use in nucleation and growth pore formation.

Suitable decomposable porogens for nucleation and growth include linear polymers, block copolymers, and multiarm stars such as element 71, in FIG. 7, and hyperbranched polymers, 81, in FIG. 8.

The porogens useful as nucleation and growth porogens include one or more polymers chosen from the group consisting of polyalkylene oxides, polyacrylates, polyacrylamides, aliphatic polycarbonates, aliphatic polysulfones, polylactones, polylactides, polystyrenes, substituted polystyrenes, poly(ether-lactones), poly(lactone-lactides), polyalkylene copolymers, poly(caprolactone-co-valerolactone), nitrogenous methacrylate copolymers, and nitrogenous vinyl copolymers.

Suitable radiation-sensitive initiators for crosslinking the matrix include photo-acids and photo-bases such as sulfonium and iodonium salts (e.g., bis(t-butyl phenyl) iodonium triflate (TBIT)), sulfonated ester of N-hydroxy succinimides, trihalomethyl triazenes, o-nitro benzyl esters, 2-nitrobenzyl carbamates, N-methylnifedipine, etc. (Harkness et al., Macromolecules, 1998, 31, 4798), and free radicals.

The next step involves patternwise exposing portions of the thin film to a radiation source either through a standard lithographic mask or scanning with an energy source (such as raster scanning with an e-beam, or an x-ray beam, or a laser). With standard negative photoresist processes, a selective area of the surface is exposed using a mask to initiate the crosslinking reaction of organosilicate matrix (typically, a silsesquioxane) by the acid or base produced from the photo initiator. Suitable radiation sources include photons, e-beams, ultraviolet radiation, or ionizing radiation. It is to be understood that for high energy radiation substantially absorbed by the matrix, photoinitiators are not necessary.

The next step is developing the organosilicate matrix. The patterns on the organosilicate matrix layer can be developed by standard wet process. Preferred development methods include soaking in tetramethylammonium hydroxide (TMAH) aqueous basic developer solution for base soluble resins and rinsing. Alternatively, the unexposed regions can be removed by suitable organic solvents.

The last step involves generation of porosity by removing (e.g., decomposing) the organic porogen phase. While this is described as the "last step," it may be carried out simultaneously with developing the photoresist, for example by the provision of suitable additives, solvents, and the like, and control of the development temperature. Preferred methods include thermolysis, organic solvent extraction, super critical fluid extraction, ozonolysis, UV assisted ozonolysis, oxidizing plasmas, and the like. All of these processes remove porogen and result in a patterned nanoporous films.

The resulting nanoporous material, typically present as a thin film on a suitable substrate, is characterized by a low dielectric coefficient, k, and an amorphous nanoporous structure, with special utility as a dielectric in high clock rate electronic structures.

While the techniques have been described herein with respect to electronic devices, it is to be understood that these techniques may also be applied to apparatus and equipment where there is a need for films of controlled nanoporosity in patterned films. For example, the techniques described herein may be used to prepare patterned, nanoporous films for use in apparatus for bioseparations, diagnostic techniques, high surface area substrates for binding reactants, reagents, catalysts, targets, and probes, sensors, electrochemical devices, and other applications which require patterned, porous materials.

EXAMPLES

Example 1

Figure 9:
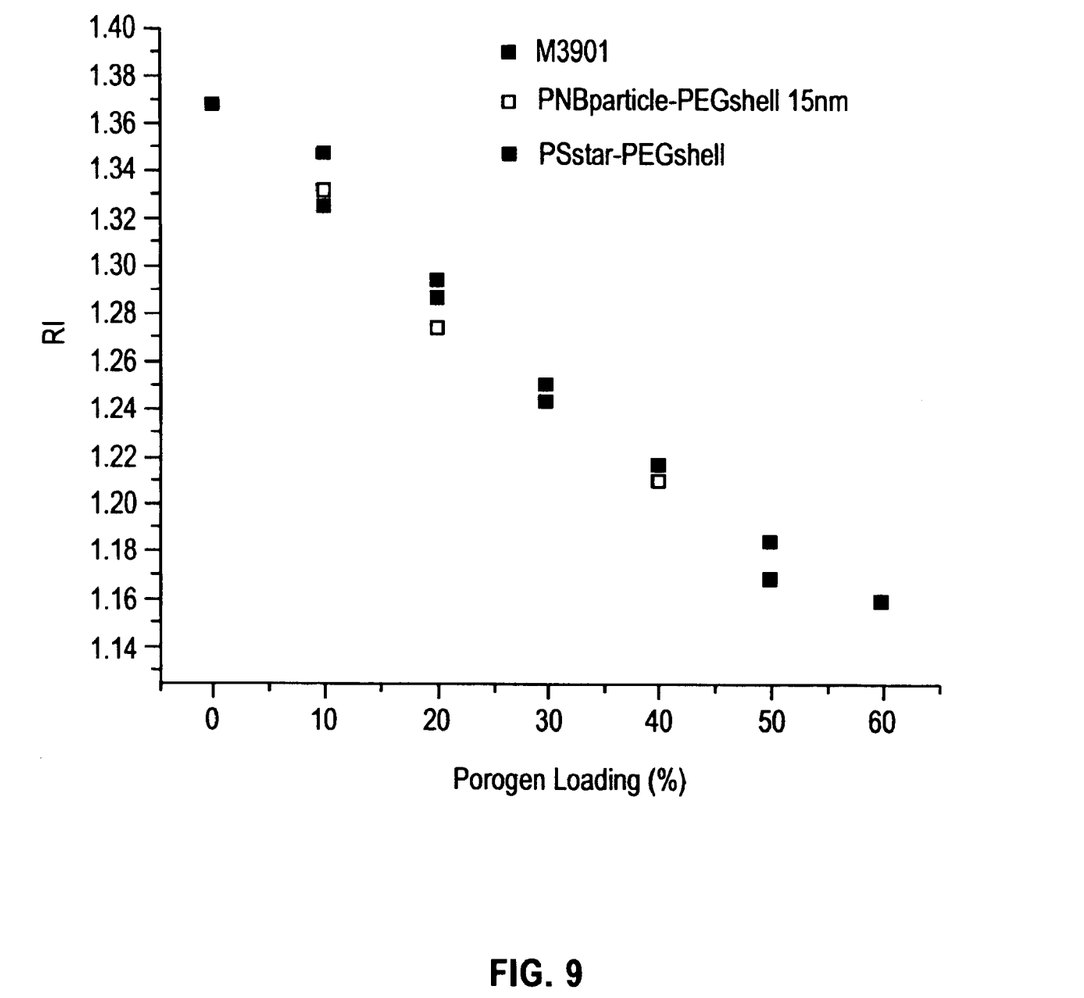
FIG. 9 shows plots of the refractive index, as a function of porogen loading for three sets of porogen loadings.

FIG. 9 shows the index of refraction RI of porous methyl silsequioxanes made from three different porogens, confirming that the structures are porous. The porogens for nucleation and growth (linear alkylene oxide) and templating (amphiphilic core shell particles) processes generate almost the same degree of porosity in organosilicate films. The refractive index determined at 632.8 nm decreases from 1.37 to 1.14 as the porogen load is increased from 0% to 60%; hence, the dielectric constant must also decrease with increased porogen loading.

Example 2

A mixture was prepared by dissolving methyl silsesquioxane (MSSQ), amphiphilic polystyrene core/polyethylene oxide methacrylate shell sacrificial organic porogen nanoparticles, and bis-t-butyl phenyl iodonium triflate photoacid generator in propylene glycol methyl ether solvent. The mixture, which was 30 wt. % porogen and 10 wt. % photoacid generator, was spin coated onto Si substrates.

Typical film thicknesses were about 1 μm. The films were prebaked for 1 min at 100° C., and then exposed to UV radiation (254 nm) through a photomask. The patterns were developed by rinsing with propylene glycol methyl ether. To generate a porous structure, the patterned film was annealed at 450° C. for two hours. The refractive index was determined at 632.8 nanometers.

Figure 10:
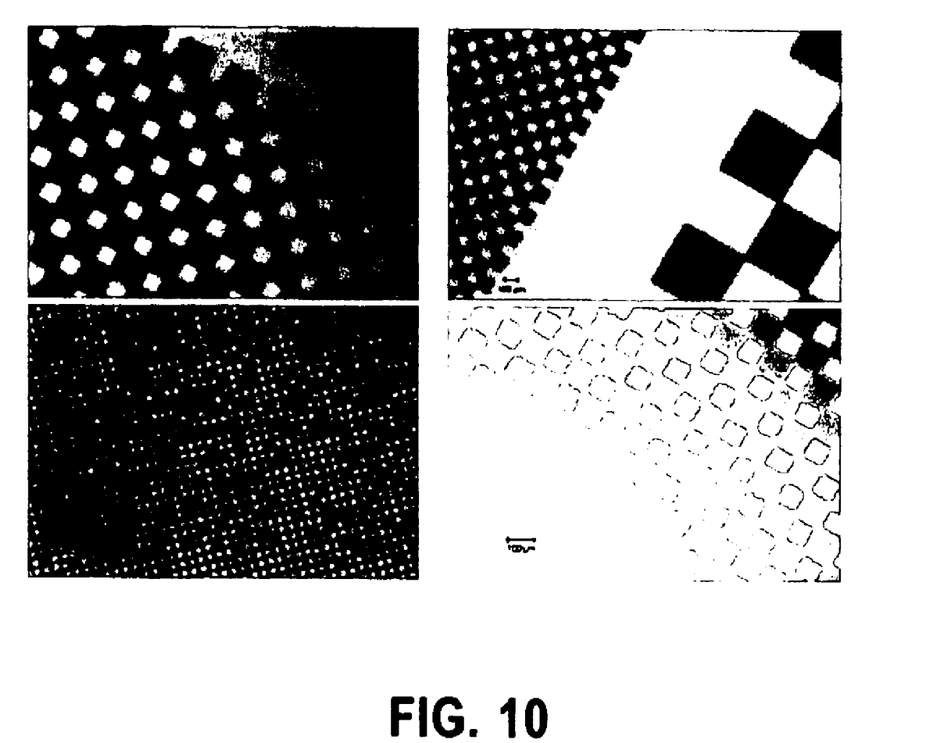
FIG. 10 shows optical microscope images of patterned nanoporous dielectric surfaces obtained by the method of the invention.
Figure 11:
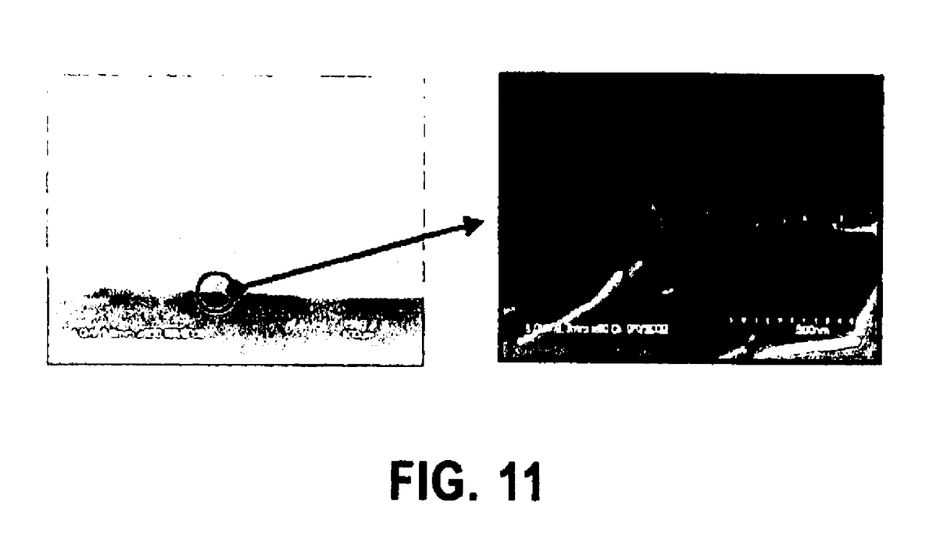
FIG. 11 shows a Field Emission Scanning Electronic Microscopy (FESEM) image of a patterned nanoporous structure of the invention. The pattern structure was prepared as described in Example 2 and has a 50 micrometer feature size.

FIG. 10 shows optical microscope images of the patterned surfaces. Well-defined features (patterns) with sizes ranging from 50 μm to 500 μm are shown in the images of FIG. 10. As shown in FIG. 11, Field Emission Scanning Electron Microscopy (FESEM) images confirm the nanoporous structure of a patterned region having features 50 micrometers in size. The refiactive index of the nanoporous film was determined as 1.23, which confirms that the thin film is porous.

Example 3

Figure 12:
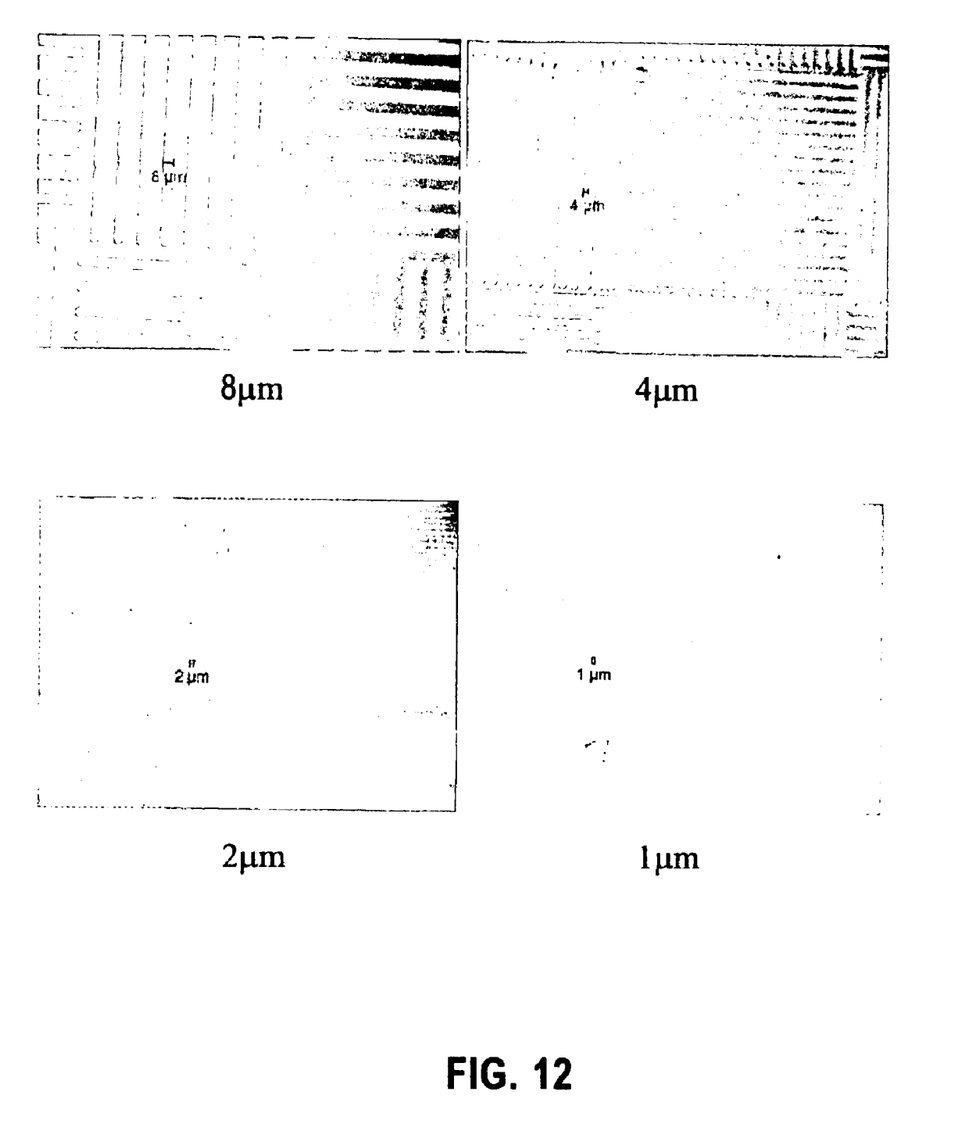
FIG. 12 shows the spatial densities of patterns in the nanoporous dielectric obtained by the method of Example 3.

Further tests were carried out to determine the spatial density of patterns obtained using the method described in Example 2. FIG. 12, shows 1, 2, 4, and 8 micrometer feature sizes obtained using the method of the invention.

While the invention has been described with respect to certain preferred embodiments and exemplifications, it is not intended to limit the scope of the invention thereby, but solely by the claims appended hereto.

What is claimed is:

1. A method of forming patterned, porous material on a substrate, comprising:
   a. depositing a layer onto a substrate, said layer comprising a reactive organosilicate material, a porogen, an initiator, and a solvent;
   b. exposing portions of the layer to radiation to change the solubility of portions of the organosilicate material with respect to the solvent;
   c. selectively removing more soluble portions of the layer to generate a relief pattern; and
   d. removing the porogen to thereby generate a porous organosilicate layer.

2. The method of claim 1, wherein the layer is nanoporous.

3. The method of claim 1, wherein said removing the porogen is performed after selectively removing portions of the layer.

4. The method of claim 1, wherein said removing the porogen is performed while selectively removing portions of the layer.

5. The method of claim 1, wherein the solubility of the organosilicate material decreases within the exposed portions, and said method comprises removing unexposed portions of the layer.

6. The method of claim 1, wherein the solubility of the organosilicate material increases within the exposed portions, and said method comprises selectively removing exposed portions of the layer.

7. The method of claim 1, wherein the organosilicate material is a silsesquioxane and comprises $(RSiO_{1.5})$ where R is independently hydrogen, or a methyl, ethyl, higher alkyl, vinyl, aryl, phenyl or substituted phenyl group.

8. The method of claim 7, wherein the silsesquioxane further comprises at least one comonomer chosen from the group consisting of $(Si(R)O_{1.5})$, $(SiO_2)$, $(SiR_2O)$, and $(SiRSiO_3)$.

9. The method of claim 7, wherein the silsesquioxane has from 10 to 500 repeating units.

10. The method of claim 1, wherein the porogen nucleates, grows, and phase separates during crosslinking of the silsesquioxane matrix.

11. The method of claim 10, wherein the porogen is a star polymer.

12. The method of claim 10, wherein the porogen is chosen from the group consisting of linear and hyperbranched macromolecules.

13. The method of claim 10, wherein the porogen comprises a polymer chosen from the group consisting of polyalkylene oxides including poly(ethylene oxide), poly (propylene oxide) and copolymers thereof, polyacrylates, polyacrylamides, aliphatic polycarbonates, aliphatic polysulfones, polylactones, polylactides, polystyrenes, substituted polystyrenes, poly(ether-lactones), poly(lactone-lactides), polyalkylene copolymers, poly(caprolactone -co-valerolactone), nitrogenous methacrylate copolymers, and nitrogenous vinyl copolymers.

14. The method of claim 1, wherein the porogen is a template for forming pores within the silsesquioxane matrix.

15. The method of claim 14, wherein the porogen comprises a multiarm radial block copolymer having an amphiphilic structure with a hydrophobic core and a hydrophilic corona.

16. The method of claim 14, comprising generating particle like behavior for templating from a non-crosslinked amphiphile by selective block collapse thereof.

17. The method of claim 14, wherein the porogen comprises a multiarm radial block copolymer having an amphiphilic structure with a hydrophobic core and a hydrophilic corona, at least one of said core and corona being crosslinked.

18. The method of claim 14, wherein the porogen comprises a crosslinked nanoparticle prepared by a process chosen from the group consisting of microemulsion polymerization and suspension polymerization.

19. The method of claim 18, wherein the hydrophobic core comprises a nonpolar polymer.

20. The method of claim 19, wherein the nonpolar polymer for the core is selected from the group consisting of polystyrene, poly α-methyl styrene, polynorbonene, polylactones, polylactides, polybutadiene, polyisoprene, polyolefins, and polyisobutylene.

21. The method of claim 15, wherein the hydrophilic corona comprises a polar polymer.

22. The method of claim 20, wherein the polar polymer is selected from the group consisting of polyethyleneglycol, polypropylene glycol, polyhydroxyalkylmethacrylate, polyalkyleneoxide acrylates, polyalkyleneoxide methacrylates, sugars, carbohydrates, polyvinyl alcohol, polyethyleneimines, polyoxazolines, polypeptides, polyvinylpyridines, acrylamides, and N,N-dimethylacrylamides.

23. The method of claim 1, wherein the initiator is activated by electromagnetic energy chosen from the group consisting of e-beam radiation, ionizing radiation, and photons, and the initiator is chosen from the group consisting of acid generators and base generators, and free radicals.

24. The method of claim 1, comprising removing the porogen by a process chosen from the group consisting of exposure to ultraviolet radiation, thermolysis, ozonolysis, plasma oxidation, solvent extraction, and supercritical fluid extraction.

25. A method of forming patterned, nanoporous material on a substrate, comprising:
   a. depositing a layer onto a substrate, said layer comprising:
      (i) an organosilicate,
      (ii) a porogen as a template for forming pores within the organosilicate said porogen comprising a multiarm radial block copolymer having an amphiphilic structure with a core and a corona, one of the core and the corona being hydrophobic, and the other of the core and the corona being hydrophilic,
(iii) an initiator, and
(iv) a solvent;
b. exposing portions of the layer to radiation to change the solubility of portions of the organosilicate with respect to the solvent;
c. selectively removing more soluble portions of the layer to generate a relief pattern; and
d. removing the porogen to thereby generate a nanoporous layer.

26. The method of claim 25, wherein the organosilicate is a silsesquioxane and comprises $(RSiO_{1.5})$ where R is independently hydrogen, or a methyl, ethyl, higher alkyl, vinyl, aryl, phenyl or substituted phenyl group.

* * * * *